(12) United States Patent
Park et al.

(10) Patent No.: US 8,689,065 B2
(45) Date of Patent: Apr. 1, 2014

(54) SEMICONDUCTOR MEMORY APPARATUS INCLUDING DATA COMPRESSION TEST CIRCUIT

(75) Inventors: Heat Bit Park, Ichon-shi (KR); Tae Sik Yun, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 602 days.

(21) Appl. No.: 12/836,519

(22) Filed: Jul. 14, 2010

(65) Prior Publication Data

US 2011/0161753 A1    Jun. 30, 2011

(30) Foreign Application Priority Data

Dec. 28, 2009 (KR) .................. 10-2009-0131780

(51) Int. Cl.
*G11C 29/00* (2006.01)

(52) U.S. Cl.
USPC .......................................... 714/723

(58) Field of Classification Search
None
See application file for complete search history.

(56) References Cited

U.S. PATENT DOCUMENTS

| | | | |
|---|---|---|---|
| 5,864,510 A | 1/1999 | Nakaoka | |
| 6,163,863 A * | 12/2000 | Schicht | 714/718 |
| 6,546,512 B1 | 4/2003 | Ochoa et al. | |
| 6,934,895 B2 * | 8/2005 | Yun | 714/718 |
| 2003/0188238 A1 | 10/2003 | Partsch et al. | |
| 2005/0213397 A1 | 9/2005 | Santin | |
| 2006/0123291 A1 * | 6/2006 | Kim | 714/724 |
| 2011/0069523 A1 * | 3/2011 | Kuroda | 365/63 |
| 2011/0102011 A1 * | 5/2011 | Van der Plas et al. | 324/762.03 |
| 2012/0104388 A1 * | 5/2012 | Choi et al. | 257/48 |

FOREIGN PATENT DOCUMENTS

| | | |
|---|---|---|
| KR | 1020040090556 A | 10/2004 |
| KR | 100527535 | 11/2005 |
| KR | 100545505 B1 | 1/2006 |
| KR | 1020060133799 A | 12/2006 |

* cited by examiner

*Primary Examiner* — Daniel McMahon
(74) *Attorney, Agent, or Firm* — William Park & Associates Patent Ltd.

(57) ABSTRACT

A semiconductor memory apparatus having stacked first and second chips includes a first chip test signal generation unit disposed in the first chip and configured to generate a first chip test signal in response to a first chip compression data determination signal in a test mode, a second chip test signal generation unit disposed in the second chip and configured to generate a second chip test signal in response to a second chip compression data determination signal in the test mode, and a final data determination unit configured to generate a final test signal in response to the first and second chip test signals in the test mode.

17 Claims, 4 Drawing Sheets

SEMICONDUCTOR MEMORY APPARATUS INCLUDING DATA COMPRESSION TEST CIRCUIT

CROSS-REFERENCE TO RELATED APPLICATION

The present application claims priority under 35 U.S.C. §119(a) to Korean Application No. 10-2009-0131780, filed on Dec. 28, 2009, in the Korean Intellectual Property Office, which is incorporated herein by reference in its entirety as if set forth in full.

BACKGROUND

1. Technical Field

Various embodiments of the present disclosure generally relate to a semiconductor memory apparatus, and more particularly, to a semiconductor memory apparatus including a data compression test circuit.

2. Related Art

A semiconductor memory apparatus has a large number of memory cells and can store high capacity data. In order to improve the reliability of the semiconductor memory apparatus, a test is generally performed to confirm whether a fail occurs in a memory cell, and a repair is conducted to replace a memory cell having the fail with a separately provided memory cell. However, since the semiconductor memory apparatus has a large number of memory cells as mentioned above, it is impossible to test the memory cells one by one to confirm whether a fail has occurred. Therefore, a test method capable of confirming a normal operation of the memory cells of the semiconductor memory apparatus within a short period of time is needed.

FIG. 1 is a diagram schematically illustrating the configuration of a conventional semiconductor memory apparatus. Referring to FIG. 1, the semiconductor memory apparatus compresses data outputted through data input/output lines from memory banks BANK0 through BANK3, and tests if a fail occurs in a memory cell by simultaneously determining compressed data. This is referred to as a data compression test for the semiconductor memory apparatus. In detail, in the case where first, third and fifth data are stored as high level data in a first memory bank BANK0, a test circuit compresses the first, third and fifth data into one data. At this time, if all of the three data have a high level, is a determination signal having, for example, a high level, is outputted and it can be appreciated that the data are normally outputted. If any one of the three data has a different level, a determination signal having, for example, a low level, is outputted and it can be appreciated that the data are not normally outputted.

FIG. 1 shows that a test is performed by compressing the data of the first bank BANK0. In FIG. 1, a 16-bit data stored in the first memory bank BANK0 of a lower memory region LDQ are compressed by a data compression unit 11 of a test circuit 10 and are loaded on global lines GIO_00<0>through GIO_03<0>. A determination unit 12 of the test circuit 10 determines whether all of the data loaded on the global lines GIO_00<0>through GIO_03<0>have the same level. Similarly, a 16-bit data stored in the first memory bank BANK0 of an upper memory region UDQ are compressed by a data compression unit 21 of a test circuit 20 and are loaded on global lines GIO_04<0>through GIO_07<0>. A determination unit 22 of the test circuit 20 determines whether all of the data loaded on the global lines GIO_04<0>through GIO_07<0>have the same level.

Therefore, the number of global lines for compressing and testing the data of the first memory bank BANK0 of the lower memory region LDQ becomes 4, and the number of global lines for compressing and testing the data of the first memory bank BANK0 of the upper memory region UDQ becomes 4 as well. As a result, the total number of is global lines necessary for one memory bank becomes 8. Therefore, in order to test a semiconductor memory apparatus which has 8 memory banks, total 64 global lines are needed.

Meanwhile, in order to elevate the degree of integration of a semiconductor apparatus, a three-dimensional semiconductor apparatus has been developed, in which a plurality of chips are stacked and packaged as a single package. Due to the fact that two or more chips are vertically stacked, the three-dimensional semiconductor apparatus can achieve an increased degree of integration in substantially the same space.

Also, recently, a through-silicon via (TSV) type semiconductor apparatus has been disclosed in the art, in which silicon vias are formed through a plurality of stacked chips so that all of the chips are electrically connected to one another. The TSV type semiconductor apparatus in which the chips are electrically connected by means of the silicon vias which vertically pass through the chips efficiently decreases the area of a package for the TSV type semiconductor apparatus when compared to a semiconductor apparatus in which respective chips are electrically connected through bonding wires bonded adjacent to the edges of the chips.

In the three-dimensional semiconductor apparatus, the number of global lines necessary to compress and test data in the same way as the conventional art dramatically increases. For example, in the case of manufacturing a single semiconductor apparatus by stacking 8 chips, if the same manufacturing process is used as in the conventional art, 64*8, that is, total 512 global lines are needed. In particular, in order to perform a test after a semiconductor memory apparatus is packaged, TSVs having a number corresponding to the number of the global lines are needed. Hence, a chip size and a layout area increases, which leads to an increase in the manufacturing cost.

SUMMARY

Various aspects of the present invention comprise a semiconductor apparatus including a data compression test circuit which can simultaneously compression-test data outputted from the memory banks of a plurality of chips.

According to one embodiment of the present invention, a semiconductor memory apparatus having stacked first and second chips comprises a first chip test signal generation unit disposed in the first chip and configured to generate a first chip test signal in response to a first chip compression data determination signal in a test mode, a second chip test signal generation unit disposed in the second chip and configured to generate a second chip test signal in response to a second chip compression data determination signal in the test mode, and a final data determination unit configured to generate a final test signal in response to the first and second chip test signals in the test mode.

According to another embodiment of the present invention, a semiconductor memory apparatus having stacked first and second chips comprises a first compression test circuit disposed in the first chip and configured to generate a first chip test signal from data outputted and compressed from a memory bank of the first chip, a second compression test circuit disposed in the second chip and configured to generate a second chip test signal from data outputted and compressed from a memory bank of the second chip, and a final data determination unit configured to generate a final test signal in response to the first and second chip test signals.

According to still another embodiment of the present invention, a semiconductor memory apparatus having stacked first and second chips comprises a first compression test circuit disposed in the first chip and configured to transmit a result of compression-testing data stored in a first memory bank of the first chip to a first through-silicon via (TSV), a second compression test circuit disposed in the first chip and configured to transmit a result of compression-testing data stored in a second memory bank of the first chip to a second TSV, a third compression test circuit disposed in the second chip and configured to transmit a result of compression-testing data stored in a first memory bank of the second chip to the first TSV, and a fourth compression test circuit disposed in the second chip and configured to transmit a result of compression-testing data stored in a second memory bank of the second chip to the second TSV.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
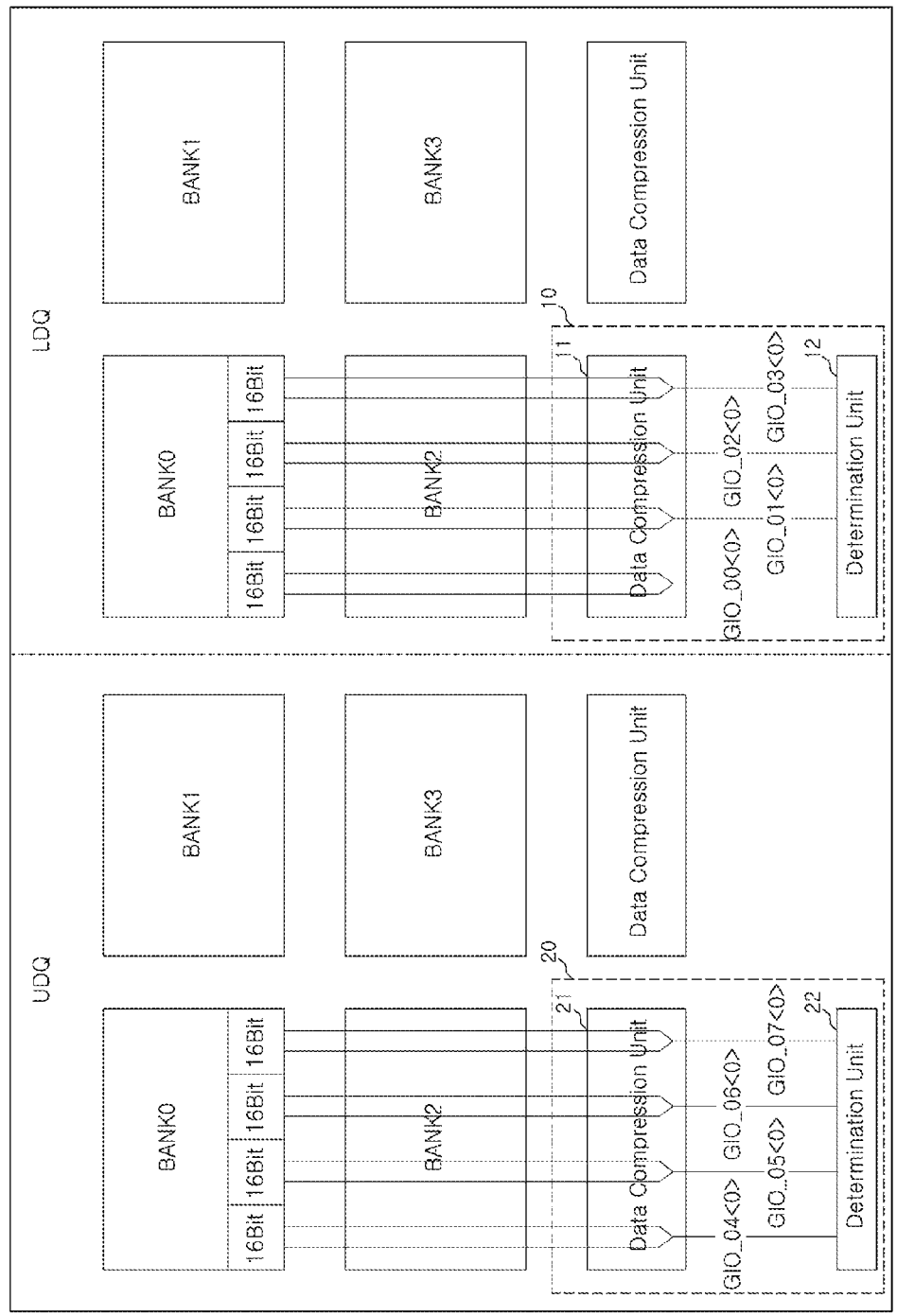
FIG. 1 is a diagram schematically illustrating a configuration of a conventional semiconductor memory apparatus.

Advantages and characteristics of the present invention and a method for achieving them will be apparent with reference to embodiments described below with reference to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

Figure 2:
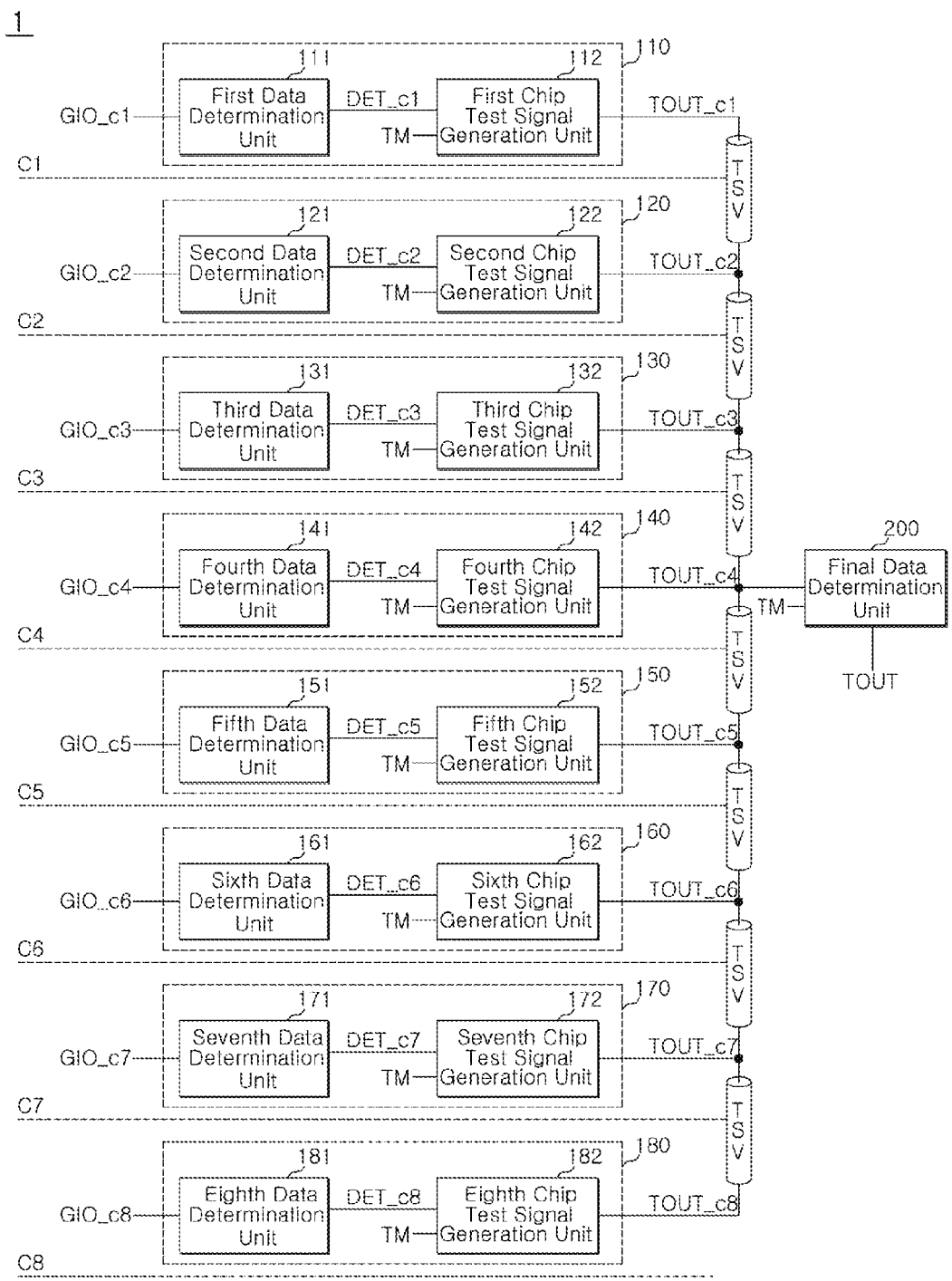
FIG. 2 is a block diagram schematically illustrating a configuration of a semiconductor memory apparatus in accordance with one embodiment of the present invention.

FIG. 2 is a block diagram schematically illustrating a configuration of a semiconductor memory apparatus in accordance with one embodiment of the present invention. Referring to FIG. 2, while first through eighth chips C1 through C8 are stacked to constitute a single semiconductor memory apparatus 1, it is to be understood that any number of stacked chips may be used. The first through eighth chips C1 through C8 have compression test circuits 110 through 180, respectively.

The first compression test circuit 110 is provided to compression-test data GIO_c1 stored in a memory bank of the first chip C1 in a test mode, and the second through eighth compression test circuits 120 through 180 are provided to compression-test data GIO_c2 through GIO_c8 stored in memory banks of the second through eighth chips C2 through C8 in the test mode. As described above, a data is compression test refers to a test wherein the data of a plurality of memory cells in which data having the same logic level are stored are compressed and a determination is made regarding whether all of the logic levels of a plurality of data are the same.

The first compression test circuit 110 may be configured to compress the data GIO_c1 outputted from the memory bank of the first chip C1 and determine whether all of the logic levels of the compressed data are the same. The first compression test circuit 110 may generate a first chip test signal TOUT_c1 depending on a determination result and transmit the first chip test signal TOUT_c1 to a through-silicon via (TSV). For example, if all of the logic levels of the compressed data are the same, the first compression test circuit 110 may disable the first chip test signal TOUT_c1. If the compressed data include data having a different logic level, the first compression test circuit 110 may enable the first chip test signal TOUT_c1.

The second compression test circuit 120 may be configured to compress the data GIO_c2 outputted from the memory bank of the second chip C2 and determine whether all of the logic levels of the to compressed data are the same. The second compression test circuit 120 may generate a second chip test signal TOUT_c2 depending on a determination result and transmit the second chip test signal TOUT_c2 to a TSV. For example, if all of the logic levels of the compressed data are the same, the second compression test circuit 120 may disable the second chip test signal TOUT_c2. If the compressed data include data having a different logic level, the second compression test circuit 120 may enable the second chip test signal TOUT_c2.

The third through eighth compression test circuits 130 through 180 may be configured to compress the data GIO_c3 through GIO_c8 outputted from memory banks constituting the third through eighth chips C3 through C8, determine the logic levels of the compressed data, and generate third through eighth chip test signals TOUT_c3 through TOUT_c8. The third through eighth chip test signals TOUT_c3 through TOUT_c8 may be transmitted to the TSV. For example, if all of the logic levels of the compressed data are the same, each of the third through eighth compression test circuits 130 through 180 disables each of the third through eighth chip test signals TOUT_c3 through TOUT_c8. If the compressed data include data having a different logic level, each of the third through eighth compression test circuits 130 through 180 enables each of the third through eighth chip test signals TOUT_c3 through TOUT_c8.

It is preferred that the first through eighth compression test circuits 110 through 180 compress and test the data outputted from the same numbered memory banks of the respective chips C1 through C8, however, other methods may also be used. That is to say, if the first compression test circuit 110 receives the data outputted from the first memory bank of the first chip C1, the second through eighth compression test circuits 120 through 180 receive the data outputted from the first memory banks of the second through eighth chips C2 through C8. Accordingly, even when a plurality of chips are stacked, the semiconductor memory apparatus 1, in accordance with the embodiment of the invention, can simultaneously perform a compression test for the data stored in the same numbered memory banks of the plurality of chips. In other words, in the case where each of the first through eighth chips C1 through C8 includes 8 memory banks, the configuration shown in FIG. 2 may be provided by the number of 8.

Referring to FIG. 2, the first compression test circuit 110 includes a first data determination unit 111 and a first chip test signal generation unit 112. The first data determination unit 111 compresses the data GIO_c1 outputted from the memory bank of the first chip C1 and generates a first chip compression data determination signal DET_c1 as a result of determining the logic levels of the compressed data. Thus, when all of the logic levels of the compressed data are the same, the first data determination unit 111 enables the first chip compression data determination signal DET_c1, and when any one of the compressed data has a different logic level, the first data determination unit 111 disables the first chip compression data determination signal DET_c1.

The first chip test signal generation unit 112 may be configured to generate the first chip test signal TOUT_c1 in response to the first chip compression data determination signal DET_c1 in a test mode. The semiconductor memory apparatus 1 can enter the test mode in response to a test mode signal TM. The first chip test signal generation unit 112 may disable the first chip test signal TOUT_c1 when the first chip compression data determination signal DET_c1 is enabled and enable the first chip test signal TOUT_c1 when the first chip compression data determination signal DET_c1 is disabled. Therefore, the first chip test signal generation unit 112 may transmit the disabled first chip test signal TOUT_c1 to the TSV when all of the data outputted and compressed from the memory bank of the first chip C1 have the same logic level and transmit the enabled first chip test signal TOUT_c1 to the TSV when at least one of the data outputted and compressed from the memory bank of the first chip C1 and has a different logic level.

The second compression test circuit 120 may include a second data determination unit 121 and a second chip test signal generation unit 122. The second data determination unit 121 may compress the data GIO_c2 outputted from the memory bank of the second chip C2 and generate a second chip compression data determination signal DET_c2 as a result of determining the logic levels of the compressed data. Thus, when all of the logic levels of the compressed data are the same, the second data determination unit 121 may enable the second chip compression data determination signal DET_c2, and when any one is of the compressed data has a different logic level, the second data determination unit 121 may disable the second chip compression data determination signal DET_c2.

The second chip test signal generation unit 122 may be configured to generate the second chip test signal TOUT_c2 in response to the second chip compression data determination signal DET_c2 in the test mode. The second chip test signal generation unit 122 may disable the second chip test signal TOUT_c2 when the second chip compression data determination signal DET_c2 is enabled and enable the second chip test signal TOUT_c2 when the second chip compression data determination signal DET_c2 is disabled. Therefore, the second chip test signal generation unit 122 may transmit the disabled second chip test signal TOUT_c2 to the TSV when all of the data outputted and compressed from the memory bank of the second chip C2 have the same logic level and transmit the enabled second chip test signal TOUT_c2 to the TSV when at least one of the data outputted and compressed from the memory bank of the second chip C2 has a different logic level.

The first and second data determination units 111 and 121 may have the same configuration as the conventional test circuits 10 and 20 shown in FIG. 1. The third through eighth compression test circuits 130 through 180 may be configured in the same manner as the first and second compression test circuits 110 and 120, accordingly, repeated explanations thereof are omitted.

A final data determination unit 200 may be configured to receive the first through eighth chip test signals TOUT_c1 through TOUT_c8 through the TSV in the test mode and generate a final test signal TOUT in response to the first through eighth chip test signals TOUT_c1 through TOUT_c8. The final data determination unit 200 may generate an enabled final test signal TOUT when all of the first through eighth chip test signals TOUT_c1 through TOUT_c8 are disabled and generate a disabled final test signal TOUT when any one of the first through eighth chip test signals TOUT_c1 through TOUT_c8 is enabled. In other words, the final data determination unit 200 may enable the final test signal TOUT when all of the logic levels of the data outputted and compressed from the memory banks of the first through eighth chips C1 through C8 are the same and disable the final chip test signal TOUT when at least one of the data has a different logic level.

Figure 3:
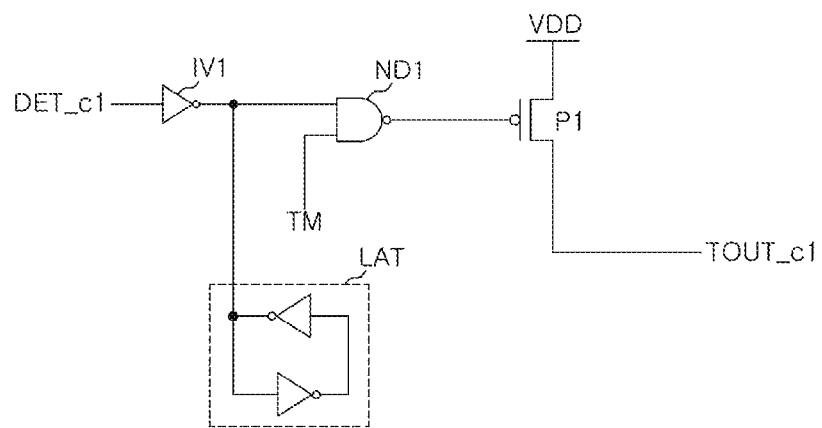
FIG. 3 is a circuit diagram illustrating the configuration of a first chip test signal generation unit shown in FIG. 2.

FIG. 3 is a circuit diagram illustrating the configuration of the first chip test signal generation unit shown in FIG. 2. Referring to FIG. 3, the first chip test signal generation unit 112 includes a first inverter IV1, a latch section LAT, a NAND gate ND1, and a p-type metal oxide semiconductor (PMOS) transistor P1. The first inverter IV1 inverts a first chip compression data determination signal DET_c1. The latch section LAT latches an output of the first inverter IV1. The NAND gate ND1 receives the test mode signal TM and the output of the first inverter IV1. The PMOS transistor P1 has a gate which receives the output of the NAND gate ND1, a source which is applied with an external supply voltage VDD, and a drain which generates the first chip test signal TOUT_c1. Hence, the first chip test signal generation unit 112 can enable the first chip test signal TOUT_c1 to a high level or disable the first chip test signal TOUT_c1 to a low level in response to the test mode signal TM and the first chip compression data determination signal DET_c1 in the test mode. In detail, when all of the logic levels of the data GIO_c1 outputted and compressed from the memory bank of the first chip C1 are the same, the first chip compression data determination signal DET_c1 may be enabled to a high level. Accordingly, since the NAND gate ND1 receives the signal disabled to a low level by the first inverter IV1, the NAND gate ND1 outputs a signal of a high level. Therefore, the PMOS transistor P1 is turned off and the first chip test signal TOUT_c1 is disabled. Conversely, when at least one of the compressed data has a different logic level, the first chip compression data determination signal DET_c1 is disabled to the low level. Accordingly, since the NAND gate ND1 receives the signal enabled to the high level by the first inverter IV1 and the test mode signal TM enabled to the high level, the NAND gate ND1 outputs a signal of a low level. Therefore, the PMOS transistor P1 is turned on and a signal enabled to the level of the external supply voltage VDD can be supplied as the first chip test signal TOUT_c1.

Since the second through eighth chip test signal generation units 122 through 182 may have the same configuration as the first chip test signal generation unit 112, repeated explanations thereof are omitted.

Figure 4:
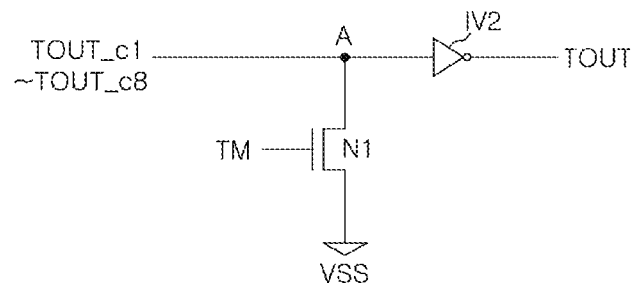
FIG. 4 is a circuit diagram illustrating the configuration of a final data determination unit shown in FIG. 2.

FIG. 4 is a circuit diagram illustrating the configuration of the final data determination unit shown in FIG. 2. Referring to FIG. 4, the final data determination unit 200 includes an n-type metal oxide semiconductor (NMOS) transistor N1 and a second inverter IV2. The NMOS transistor N1 has a gate which receives the test mode signal TM, a drain which is connected to a ground voltage VSS, and a source which is connected with a node A. The node A is connected with the TSV and receives the first through eighth chip test signals TOUT_c1 through TOUT_c8 outputted from the first through eighth compression test circuits 110 through 180. The second inverter IV2 outputs the final test signal TOUT which has an inverted level of the voltage level of the node A.

When all of the logic levels of the data outputted and compressed from the memory banks of the first through eighth chips C1 through C8 are the same, since the disabled first through eighth chip test signals TOUT_c1 through TOUT_c8 are outputted from the first through eighth compression test circuits 110 through 180, the node A has the level of the ground voltage VSS by the NMOS transistor N1. The second inverter IV2 inverts the level of the ground voltage VSS and generates the final test signal TOUT which is enabled to a high level.

Conversely, when at least one of the data outputted and compressed from the memory banks of the first through eighth chips C1 through C8 has a different logic level, the first through eighth chip test signals TOUT_c1 through TOUT_c8 are enabled. In this regard, the case in which at least one of the data outputted and compressed from the memory bank of the first chip Cl has a different logic level is described below.

In this case, the first chip test signal generation unit 112 of the first compression test circuit 110 generates the first chip test signal TOUT_c1 which is enabled to the level of the external supply voltage VDD and the second through eighth compression test circuits 120 through 180 generate the second through eighth chip test signals TOUT_c2 through TOUT_c8 which are disabled. At this time, it is preferred that the driving force of the PMOS transistor P1, which constitutes the first chip test signal generation unit 112, be greater than the driving force of NMOS transistor N1 which constitutes the final data determination unit 200, although other embodiments may also be used. This is because the output of the final test signal TOUT is changed when only one chip test signal is enabled. Thus, as the first chip test signal TOUT_c1 is applied at the level of the external supply voltage VDD, even though the NMOS transistor N1 supplies the level of the ground voltage VSS, the voltage level of the first node A can be changed to a high level, and, as a result, the final test signal TOUT which is disabled to the low level can be generated. The second through eighth chip test signal generation units 122 through 182 may have the same configuration as the first chip test signal generation unit 112 and can operate in the same way.

In the semiconductor memory apparatus having a plurality of stacked chips according to the present invention, compression test results of the data associated with the respective memory banks of the plurality of chips are transmitted to the same TSV and a final test result is produced. Hence, since it is sufficient to provide TSVs, which have a number corresponding to the number of the global lines used in a single chip, for a compression test of the plurality of chips, a layout margin of the semiconductor memory apparatus can be secured, and a chip size can be decreased. In particular, the invention may be maximized in its effective value when the semiconductor memory apparatus is packaged.

Figure 5:
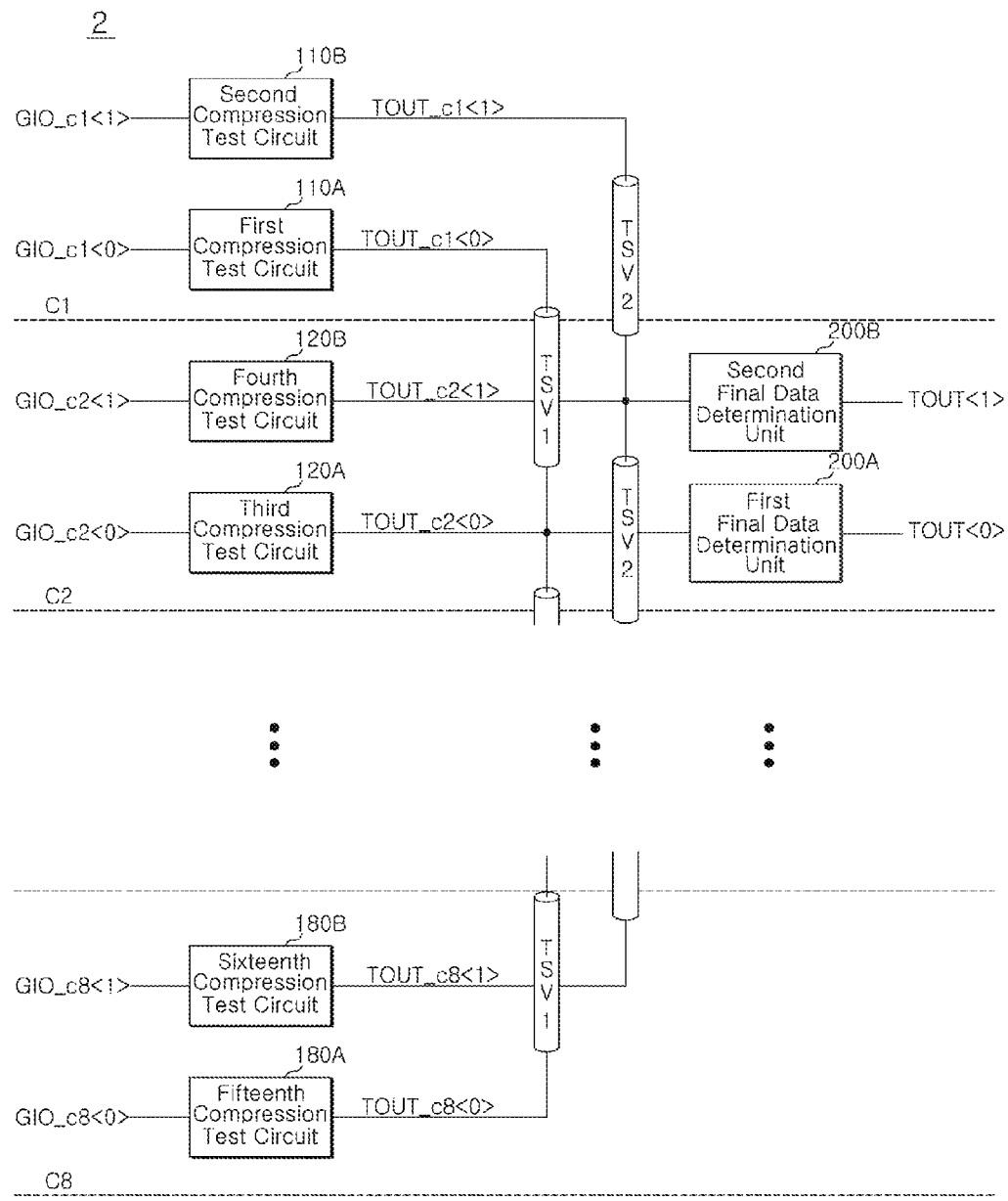
FIG. 5 is a block diagram schematically illustrating the configuration of a semiconductor memory apparatus in accordance with one embodiment of the present invention.

FIG. 5 is a block diagram schematically illustrating the configuration of a semiconductor memory apparatus 2 in accordance with one embodiment of the present invention. Referring to FIG. 5, a lo first chip Cl includes first and second compression test circuits 110A and 110B. The first and second compression test circuits 110A and 110B may be configured to compression-test data GIO_c1<0> and GIO_c1<1> which are outputted from the first and second memory banks of the first chip C1 and generate first chip test signals TOUT_c1<0> and TOUT_c1<1>. A second chip C2 includes third and fourth compression test circuits 120A and 120B. The third and fourth compression test circuits 120A and 120B may be configured to compression-test data GIO_c2<0> and GIO_c2<1> which are outputted from the first and second memory banks of the second chip C2 and generate second chip test signals TOUT_c2<0> and TOUT_c2<1>. Fifth through sixteenth compression test circuits 130A through 180A and 130B through 180B which are provided in the third through eighth chips C3 through C8 may be configured in the same manner.

The first chip test signal TOUT_c1<0> generated by the first compression test circuit 110A, the second chip test signal TOUT_c2<0> generated by the third compression test circuit 120A, and an eighth chip test signal TOUT_c8<0> generated by a fifteenth compression test circuit 180A are transmitted to a first TSV TSV1. Further, the first chip test signal TOUT_c1<1> generated by the second compression test circuit 110B, the second chip test signal TOUT_c2<1> generated by the fourth compression test circuit 120B, and an eighth chip test signal TOUT_c8<1> generated by a sixteenth compression test circuit 180B may be transmitted to a second TSV TSV2.

A first final data determination unit 200A may be configured to receive the first through eighth chip test signals TOUT_c1<0> through TOUT_c8<0> from the first TSV TSV1 and output a first final test signal TOUT<O>, and may generate a compression test result for the data GIO_c1<0> through GIO_c8<0> outputted from the first memory banks of the first through eighth chips C1 through C8. A second final data determination unit 200B may be configured to receive the first through eighth chip test signals TOUT_c1<1> through TOUT_c8<1> from the second TSV TSV2 and output a second final test signal TOUT<1>, and may generate a compression test result for the data GIO_c1<1> through GIO_c8<1> outputted from the second memory banks of the first through eighth chips C1 through C8.

As is apparent from the above description, even though a plurality of chips are stacked, a data compression test can be simultaneously performed for the same numbered memory banks of the stacked chips. Thus, a compression test for a semiconductor memory apparatus can be performed using TSVs which have a number corresponding to the number of global lines which are needed for a data compression test of a single chip.

While certain embodiments have been described above, it will be understood to those skilled in the art that the embodiments described are by way of example only. Accordingly, the semiconductor memory apparatus including a data compression test circuit described herein should not be limited based on the described embodiments. Rather, the a semiconductor memory apparatus including a data compression test circuit described herein should only be limited in light of the claims that follow when taken in conjunction with the above description and accompanying drawings.

What is claimed is:

1. A semiconductor memory apparatus having stacked first and second chips, comprising:
  a first chip test signal generation unit disposed in the first chip and configured to generate a first chip test signal in response to a first chip compression data determination signal in a test mode, wherein the first chip compression data determination signal is generated based on a plurality of data outputted and compressed from the first chip;

a second chip test signal generation unit disposed in the second chip and configured to generate a second chip test signal in response to a second chip compression data determination signal in the test mode, wherein the second chip compression data determination signal is generated based on a plurality of data outputted and compressed from the second chip; and a final data determination unit configured to generate a final test signal in response to the first and second chip test signals in the test mode.

2. The semiconductor memory apparatus according to claim 1, wherein the final data determination unit is disposed in one of the first and second chips.

3. The semiconductor memory apparatus according to claim 1, wherein the first and second chip test signals are transmitted to the final data determination unit through a through-silicon via (TSV).

4. The semiconductor memory apparatus according to claim 1, wherein the first chip compression data determination signal is enabled when the plurality of data outputted and compressed from the first chip has the same logic values, and is disabled when one of the plurality of data has a different level.

5. The semiconductor memory apparatus according to claim 4, wherein the first chip test signal generation unit is configured to enable the first chip test signal when the first chip compression data determination signal is disabled.

6. The semiconductor memory apparatus according to claim 1, wherein the second chip compression data determination signal is enabled when the plurality of data outputted and compressed from the second chip has the same logic values, and is disabled when one of the plurality of data has a different level.

7. The semiconductor memory apparatus according to claim 6, wherein the second chip test signal generation unit is configured to enable the second chip test signal when the second chip compression data determination signal is disabled.

8. The semiconductor memory apparatus according to claim 1, wherein the final data determination unit is configured to disable the final test signal when one of the first and second chip test signals is enabled.

9. A semiconductor memory apparatus having stacked first and second chips, comprising:

a first data determination unit configured to determine logic levels of data outputted and compressed from a memory bank of the first chip and generate a first chip compression data determination signal; and a first chip test signal generation unit configured to generate a first chip test signal in response to the first chip compression data determination signal;

a second data determination unit configured to determine logic levels of data outputted and compressed from a memory bank of the second chip and generate a second chip compression data determination signal; and a second chip test signal generation unit configured to generate a second chip test signal in response to the second chip compression data determination signal; and a final data determination unit configured to generate a final test signal in response to the first and second chip test signals.

10. The semiconductor memory apparatus according to claim 9, wherein the first data determination unit is configured to enable the first chip compression data determination signal when the data have the same logic values and disable the first chip compression data determination signal when one of the data has a different logic level.

11. The semiconductor memory apparatus according to claim 9, wherein the first chip test signal generation unit is configured to disable the first chip test signal when the first chip compression data determination signal is enabled and enable the first chip test signal when the first chip compression data determination signal is disabled.

12. The semiconductor memory apparatus according to claim 9, wherein the second data determination unit is configured to enable the second chip compression data determination signal when the data have the same logic values and disable the second chip compression data determination signal when one of the data has a different logic level.

13. The semiconductor memory apparatus according to claim 9, wherein the second chip test signal generation unit is configured to disable the second chip test signal when the second chip compression data determination signal is enabled, and enable the second chip test signal when the second chip compression data determination signal is disabled.

14. The semiconductor memory apparatus according to claim 9, wherein the final data determination unit is disposed in one of the first and second chips.

15. The semiconductor memory apparatus according to claim 9, wherein the first and second chip test signals are transmitted to the final data determination unit through a through-silicon via (TSV).

16. A semiconductor memory apparatus having stacked first and second chips, comprising:

a first compression test circuit disposed in the first chip and configured to transmit a result of compression-testing data stored in a first memory bank of the first chip to a first through-silicon via (TSV);

a second compression test circuit disposed in the first chip and configured to transmit a result of compression-testing data stored in a second memory bank of the first chip to a second TSV;

a third compression test circuit disposed in the second chip and configured to transmit a result of compression-testing data stored in a first memory bank of the second chip to the first TSV;

a fourth compression test circuit disposed in the second chip and configured to transmit a result of compression-testing data stored in a second memory bank of the second chip to the second TSV;

a first final data determination unit configured to generate a first final test signal depending on test results of the first and third compression test circuits; and a second final data determination unit configured to generate a second final test signal depending on test results of the second and fourth compression test circuits.

17. The semiconductor memory apparatus according to claim 16, wherein the first and second final data determination units are disposed in one of the first and second chips.

* * * * *